United States Patent [19]

Yoshimura

[11] 4,337,433

[45] Jun. 29, 1982

[54] CLOCK SIGNAL DISTRIBUTING CIRCUIT ADJUSTING DEVICE AND METHOD

[75] Inventor: Tatsuro Yoshimura, Kawasaki, Japan

[73] Assignee: Fujitsu Limited, Kawasaki, Japan

[21] Appl. No.: 103,928

[22] Filed: Dec. 17, 1979

[51] Int. Cl.³ .................... H03K 5/159; H03K 17/00
[52] U.S. Cl. ................................ 328/55; 307/606; 328/105
[58] Field of Search ............... 328/103, 105, 55, 60; 307/208, 606

[56] References Cited

U.S. PATENT DOCUMENTS

| | | | |
|---|---|---|---|
| 3,505,593 | 4/1970 | Gram et al. | 328/55 |
| 3,792,362 | 2/1974 | Grant | 328/55 |
| 4,165,490 | 8/1979 | Howe, Jr. et al. | 328/55 |
| 4,197,506 | 4/1980 | Fogelstrom | 328/55 |

*Primary Examiner*—Stanley D. Miller, Jr.
*Assistant Examiner*—B. P. Davis
*Attorney, Agent, or Firm*—Staas & Halsey

[57] ABSTRACT

A clock signal distributing circuit is provided in its transmission line with delay time varying means and arranged so that a signal at the output terminal of the transmission line is opposite in phase to a signal at its input terminal. In the adjustment of the delay time, the input and output terminals are short-circuited by a line having a predetermined delay time to form a loop, causing oscillation. The sum of the rise and fall delay times of this loop-like transmission line is the oscillation cycle. Since the rise delay time and the fall delay time are substantially equal to each other over the entire loop, the delay time of the loop-like transmission line is obtained as ½ of the reciprocal of the oscillation frequency (the oscillation cycle), and from the delay time thus obtained is subtracted the delay time of the short-circuiting line to obtain the delay time between the input and output terminals of the clock signal distributing circuit. The abovesaid frequency is measured by means of a frequency counter. The delay time is adjusted, for example, by changing the length of a discrete wire.

18 Claims, 6 Drawing Figures

CLOCK SOURCE

4: LOAD LSI

CHOPPER CIRCUIT

LOAD LSI

CLOCK SIGNAL DISTRIBUTING CIRCUIT ADJUSTING DEVICE AND METHOD

BACKGROUND OF THE INVENTION

1. Field of the Invention

This invention relates to a clock signal distributing circuit device and a method for adjusting the phase of a clock signal in digital electronic apparatus, in particular, a large-sized, high-speed computer and so forth.

2. Description of the Prior Art

Recently the operating speed of digital electronic apparatus has been raised higher and higher; nowadays, the cycle of a clock signal is required to be shorter than 10 nanoseconds and its pulse width is also required to be in the range of 1 to 2 nanoseconds. As a consequence, the phase difference between clock signals distributed to respective circuits must be adjusted with an accuracy to less than 1 nanosecond.

Conventional clock signal distributing circuit systems are merely to increase the number of fanouts of an input clock signal and to distribute them. That is, a clock pulse waveform (cycle and pulse width) required in each load is produced by a clock source and divided by a distributing circuit into a plurality of signals, which are each applied directly to a circuit used as a load, for example, a flip-flop, a latch circuit or the like. Since the distributing circuit is formed by ordinary logic gate elements, a waveform shaping effect is produced, but neither the pulse width nor the cycle of the clock signal is changed. In the case of a clock signal of small pulse width and cycle being required, however, if such a waveform is produced by the clock source itself, the waveform becomes dull in the transmission line or in the distributing circuit, or the pulse width undergoes an unwanted change due to a difference between delays in the rise and fall of the signal, resulting in a difficulty in an accurate clock signal supply to all loads.

Further, in order to make the clock signals at the input terminals of all the load circuits in-phase with one another, it is necessary that the transmission lines from the clock source to the load circuits have the same signal delay time. With a conventional method, signals at two load terminals are connected to a two channel oscilloscope via cables of the same length and an adjustment is made so that their waveforms become in-phase with each other on the display surface of the oscilloscope. In the case of the cycle of the clock signal being on the order of nanoseconds, however, a slight difference in the cable length or the accuracy of the phase adjustment in the oscilloscope present a problem to make sufficient phase adjustment difficult.

SUMMARY OF THE INVENTION

It is therefore an object of this invention to provide a distributing circuit and a phase adjusting method for high-speed, high-accuracy clock signals.

Another object of this invention is to permit highly accurate and easy phase adjustment of a clock signal.

Another object of this invention is to enable the supply of clock signals of accurate pulse width to all loads.

In accordance with one aspect of the present invention, a clock distributing circuit is adapted so that the signal at the output terminal of a transmission line becomes opposite in phase to a signal at the input terminal, and the input and output terminals are short-circuited by a line of a constant length to cause oscillation, and then the delay of the transmission line is adjusted to make the oscillation frequency have a predetermined value while counting the oscillation frequency by a counter. The frequency measurement by the counter can be made accurate to the order of nanoseconds and the frequency is displayed in digital form, so that the phase adjustment is easy.

In accordance with another aspect of the present invention a clock pulse is shaped in the transmission line into a waveform having a duty ratio of 50%, thereby to prevent the pulse from disappearing.

In accordance with another aspect of the present invention, there is provided in the neighborhood of a load circuit a chopper circuit for reducing the pulse width of a clock signal to a desired small value, thereby to prevent the influence of dullness of the waveform in the transmission line. Further, for reducing the period of the clock pulse, a frequency multiplier can be provided in the vicinity of the load circuit.

Other objects, features and advantages of the present invention will hereinafter become more fully apparent from the following description taken in conjunction with the accompanying drawings, which illustrate several preferred embodiments of the invention.

DESCRIPTION OF THE PREFERRED EMBODIMENTS

Figure 1:
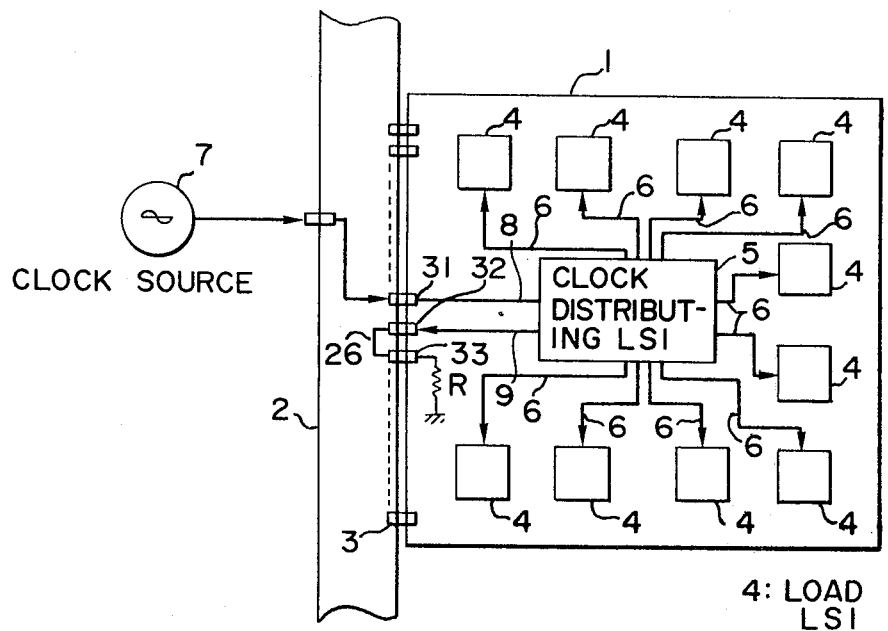
FIG. 1 is a block diagram illustrating the construction of a printed circuit board in an embodiment of this invention.

FIGS. 1 to 4 illustrate an embodiment of this invention. In FIG. 1, a printed circuit board 1 is connected with a mother board 2 by means of connectors 3. On the printed circuit board 1, a number of load integrated circuit elements (LSI) 4 are packaged and, at the center of the board 1, a clock distributing LSI 5 is provided for distributing clock signals to the LSI's 4 via printed wires 6 all of the same length (or otherwise having known relative signal propagation times). The clock distributing LSI 5 is supplied with a clock signal from a clock source 7 via the mother board 2, a connector terminal 31 and a printed wire 8. From the clock distributing LSI 5, a clock signal is also distributed to a connector 32 of the mother board 2 via a printed wire 9. This clock signal is used for the phase adjustment described later.

As described previously, when the pulse width of the clock signal is smaller than several nanoseconds, it is very difficult, due to dullness of its waveform, to transmit the clock signal while accurately retaining its pulse width over the transmission line from the clock source 7 to each load LSI 4. To avoid this difficulty, in the present invention, the duty ratio of the pulse from the clock source is selected to be about 50% and a chopper circuit is provided in each load LSI 4, by which the pulse width is rendered into a desired one, and then the clock signal is applied to each latch circuit of the load LSI 4.

Figure 2:
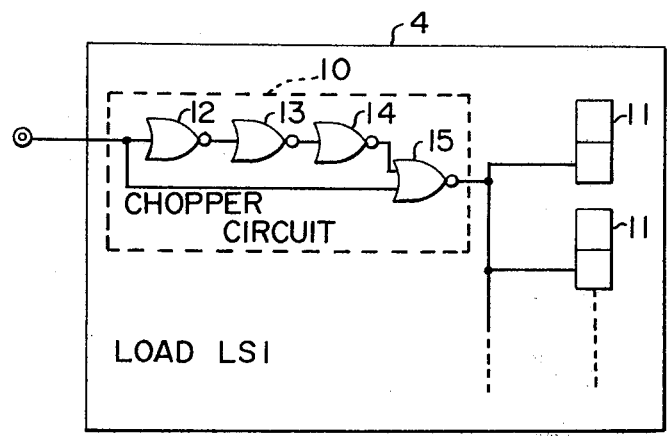
FIG. 2 is a circuit diagram of one part of a load LSI in the embodiment of FIG. 1.

FIG. 2 shows one part of the internal circuit arrangement of the load LSI 4. Reference numeral 10 indicates a chopper circuit; 11 designates latch circuits; 12 to 14 identify 1-input NOR gates (or inverters); and 15 denotes a 2-input NOR circuit. The chopper circuit 10 yields, from the moment of the fall of a clock signal applied to a clock input terminal, a positive pulse whose pulse width is equal to the sum of delay times of the three NOR gate circuits 12 to 14.

If the rise and fall delays of a signal in the transmission line (a cable or printed wire) or in the gate circuit of the distributing circuit are equal to each other, or distributed uniformly as a whole though not equal for each part, the pulse width ought not to vary. In actual parts and elements, however, there is dispersion in their characteristics, and when the dispersion in delay in substantially equal to the pulse width, the pulse may disappear in an extreme case. This can be solved by transmitting the clock signal with a sufficient pulse width in the vicinity of a duty cycle of 50% over the transmission line and shaping the signal into a desired pulse width in the load LSI 4, as shown in FIG. 2.

Figure 3A:
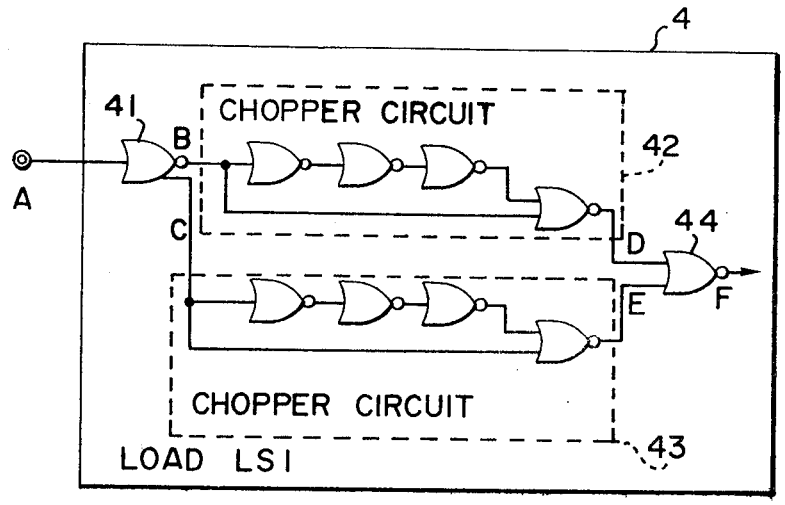
FIG. 3A is a circuit diagram showing another example of one part of the load LSI in accordance with this invention.
Figure 3B:
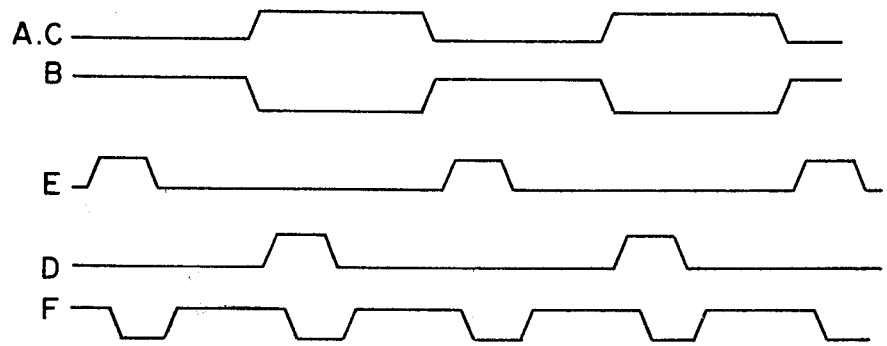
FIG. 3B shows a series of waveforms which occur at respective parts in FIG. 3A.

In the case of a high-speed clock signal being required, the purpose can be attained by frequency multiplying the clock signal in the load LSI 4, as depicted in FIG. 3A. In FIG. 3A, a signal from an input terminal A is divided by an OR-NOR gate 41 into positive- and negative-phase signals, which are respectively applied to chopper circuits 42 and 43 via terminals B and C. The chopper circuits 42 and 43 are identical in construction and operation with the chopper circuit 10 shown in FIG. 2. The outputs derived from the chopper circuits 42 and 43 at output terminals D and E are provided to a 2-input NOR gate 44 to derive therefrom a pulse of a frequency twice as high as the input to the input terminal A, and the pulse width is equal to the delay time of the three stages of NOR gates. The waveforms occurring at the respective parts of the circuit of FIG. 3A are as shown in FIG. 3B.

Figure 4:
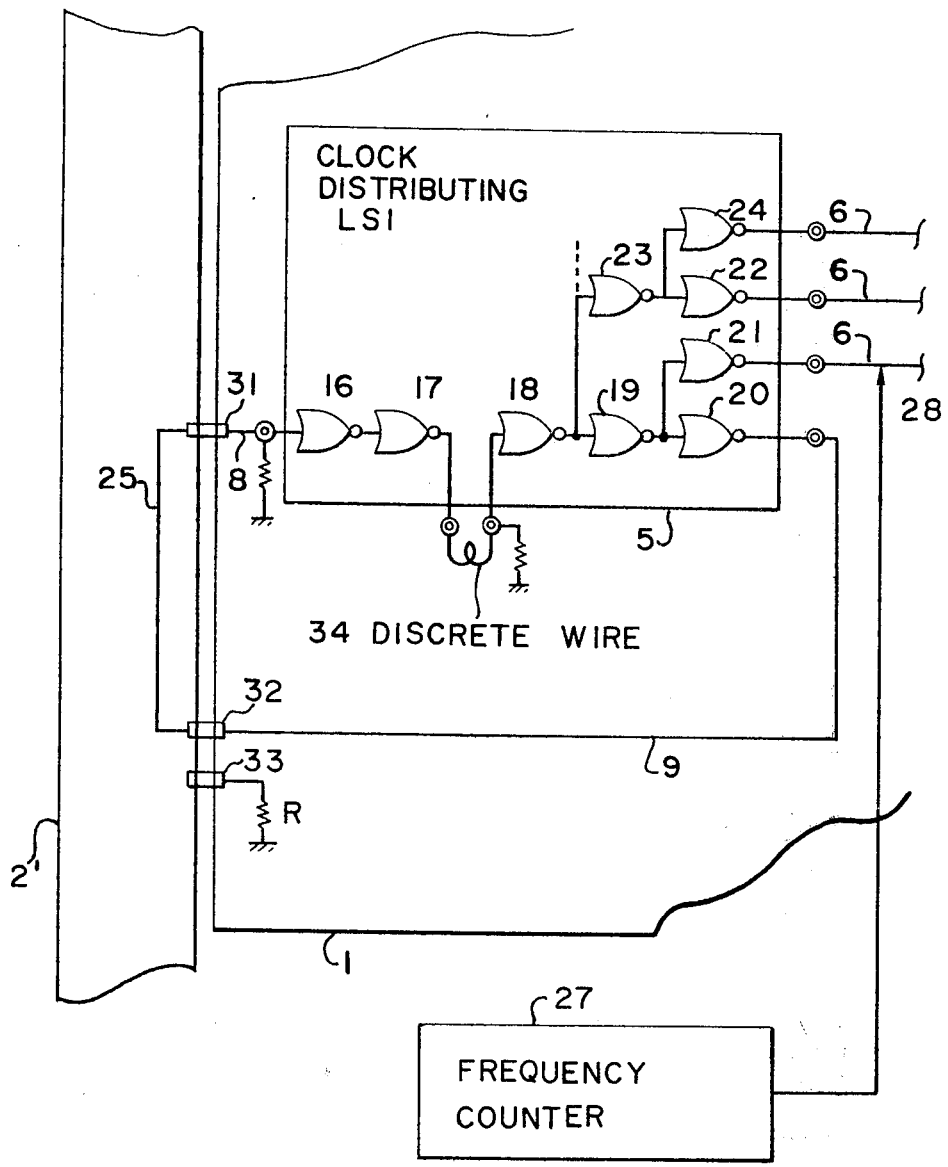
FIG. 4 is a block diagram explanatory of the phase adjusting method of this invention.

FIG. 4 shows a circuit arrangement for adjustment of the phase of the clock signal. With reference to FIG. 4, a description will be given of the operation by which the delay time of the printed circuit board 1 from the connector terminal 31 to the connector terminal 32 via the clock distributing LSI 5 and the printed wire 9 is adjusted to be equal to a certain value. In FIG. 4, a mother board 2' is one solely for phase adjustment use which is different from the mother board 2 shown in FIG. 1, and the board 2' has formed thereon a printed wire 25. Reference numerals 16 to 24 are all 1-input NOR gate circuits, and the NOR gates 18 to 24 are connected in the form of trees so as to increase the number of branches. The numbers of NOR gates connected between the input terminal and respective output terminals are all odd so that the outputs may be reverse in phase from the input. When the printed circuit board 1 having such a clock distributing LSI 5 is connected with the mother board 2' for phase adjustment use, input and output terminals of the clock distributing LSI 5 are short-circuited by the printed wire 25 of the mother board 2' via the printed wires 8 and 9 of the printed circuit board 1, oscillation occurs. The sum of pulse rise and fall delay times of the loop-like transmission line is the oscillation period. Since the clock distributing LSI 5 is formed by NOR gate circuits of the same construction, the rise delay and the fall delay are substantially equal to each other as a whole. Accordingly, if this oscillation frequency is determined, the sum of the rise and fall delay times of the abovesaid loop-like transmission line can be obtained as the oscillation cycle; but since the rise and fall delay are substantially equal as a whole (or otherwise, the rise time known relative to the fall time), the rise or fall delay time of the loop-like transmission line is obtained as $\frac{1}{2}$ of the abovesaid oscillation cycle.

Reference numeral 27 indicates a frequency counter for measuring the oscillation frequency from the printed wire 6 by means of a high impedance probe 28. In this case, there is a fear that, if the probe 28 is connected to the printed wire 9, stray capacity is added to disturb the frequency. If the delay time along the printed wires 9 and is preknown, then the delay time from the input terminal to the output terminal of the clock distributing LSI 5 can be obtained by subtracting the preknown delay time from the half of reciprocal of the frequency.

Figure 5:
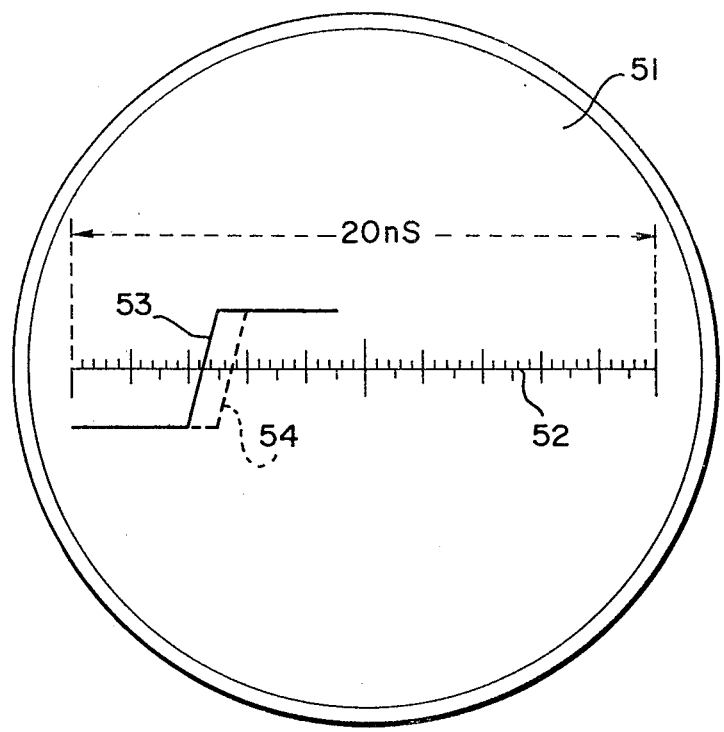
FIG. 5 is a diagram showing figures appearing on the display surface of an oscilloscope in accordance with a conventional phase adjusting method.

Now, the above embodiment will be described as being applied to conventional delay time measurement using a two channel oscilloscope. The output terminal of the clock source 7 and the point where a delay is to be measured, for example, the input of the load LSI 4 in FIG. 1 or the connector terminal 32 in FIG. 4, are respectively connected to inputs of the two channel oscilloscope via cables of the same delay time. In this case, such figures as shown in FIG. 5 are displayed on the display surface of the oscilloscope. In FIG. 5, reference numeral 51 indicates the display surface of the oscilloscope; 52 designates a time scale, whose total length corresponds to 20 nanosec. and whose minimum scale value corresponds to 400 picoseconds (=20 nanosec./50); 53 identifies a figure showing the rise of a pulse of the input applied from the terminal of the clock source 7; and 54 denotes a figure showing the rise of a pulse of the input applied from the point where a delay is to be measured. The delay time can be available from graduations of the time scale 52. The accuracy of the measurement is 400 picoseconds corresponding to the minimum scale value, that is, about ±200 picoseconds. In contrast thereto, in the present invention the oscillation frequency is counted, and in this kind of frequency counter, accuracy of $10^{-6}$ with respect to 20 nanoseconds is ordinary; accordingly, high accuracy of about $10^{-2}$ picoseconds can be obtained. In the conventional measurement using an oscilloscope, the graduation is read with the naked eye, and accordingly the efficiency of the measurement is low; but, in the present invention, the counter output is displayed in digital form and can easily be read to provide for enhanced efficiency in the measurement.

In the case of adjusting the delay time from the connector terminal 31 to the terminal 32 via the clock distributing LSI 5 to a desired value, the delay time is adjusted to a frequency value corresponding to the desired value.

In the embodiment of FIG. 4, the delay time is adjusted by changing the length of a discrete wire 34 provided in the transmission line of the clock distributing circuit. The clock signal applied via the printed wire 8 to the clock distributing LSI 5 is, after being buffered via the NOR gates 16 and 17, once outputted at an external pin and fed again to the LSI 5 via the discrete wire 34, thereafter being provided to the NOR gates connected in the form of trees. The discrete wire 34 is not a printed conductor but is stretched between external pins and can be adjusted in length, and if the length of the discrete wire 34 is selected large, the delay time increases correspondingly. The adjustment of the delay time is not limited specifically to the method using such a discrete wire. For example, it is possible to provide a plurality of series connections of NOR gates of different stages between the NOR gates 17 and 18 and designate, from the outside, which one of them is to be used.

The discrete wire 34 need not always be led out from the middle of the NOR gate group as shown in FIG. 4 but may be provided at the middle of the printed wire 8 of the input part of the clock distributing LSI 5, in which case two pins of the clock distributing LSI 5 can be saved. In the case where a plurality of clock distributing LSI's 5 are mounted on one printed circuit board 1, however, if each clock distributing LSI 5 is branched from the printed wire 8 via a discrete wire, then there is the likelihood that if the length of a second discrete wire is changed for adjustment with respect to a second clock distributing LSI 5 after adjustment of the length of a first discrete wire with respect to a first clock distributing LSI 5, the adjustment of the first clock distributing LSI 5 is disturbed. Accordingly, in the case of using a plurality of clock distributing LSI's 5 in parallel, it is preferred to buffer the input clock signal by the NOR gates 16 and 17 and then apply it to the discrete wire 34. The length of the printed wire 9 need not always be equal to the length of the printed wire 6. Further, the printed wire 9 need not always be used solely for adjustment use but may also be used for the clock distribution to the load LSI 4. In such a case, it is a matter of course that the line from the output end of the clock distributing LSI 5 to the load LSI 4 is equal in length to the printed wire 6.

In FIG. 1, a plurality of printed circuit boards 1 are usually connected with the mother board 2, but in such a case, all lines from the clock source 7 to the connector terminals 31 of the printed circuit boards 1 are naturally equal in length.

When connected to the mother board 2, the printed wire 9 is terminated with a terminating resistor R via the printed wire 26 and a connector terminal 33.

It is also possible to provide a plurality of such clock distribution systems as shown in FIG. 1. That is, a clock signal is supplied from the clock source 7 to a first printed circuit board via the mother board 2; an interboard clock distributing circuit is provided in the first printed board; the clock signal is distributed to a plurality of second printed circuit boards 1 via the mother board 2; thereafter, the clock signal is distributed by the clock distributing circuit 5 of each printed circuit board to each load LSI 4, as is the case with FIG. 1. In this case, it is natural that lines from respective output ends of the inter board clock distributing circuit of the first printed circuit board to input terminals of the respective second printed circuit boards are of the same length. It is needless to say that the method described previously with respect to FIG. 4 is applied to the adjustment of the delay time from the input terminal of the first printed circuit board to each output terminal thereof.

Numerous changes may be made in the above described circuits and method, and different embodiments of the invention may be made without departing from the spirit thereof; therefore it is intended that all matter contained in the foregoing description and in the accompanying drawings shall be interpreted as illustrative and not in a limiting sense.

What is claimed is:

1. A method for adjusting to a desired value the delay time for transmitting a pulse from an input terminal of a clock signal distributing circuit to at least a selected one of plural output terminals thereof the relative difference, between the respective delay times corresponding to each said output terminal being preknown, for distributing with known distribution times a clock signal from a clock signal source that is applied to said input terminal to a plurality of load circuits from respective ones of said output terminals, said selected output terminal having an output corresponding to said pulse that is opposite in phase from the pulse as applied to said input terminal, said clock signal distributing circuit having a rise time that is known in relation to the fall time for transmission of the respective rising and falling edges of each said clock signal being transmitted from said input terminal to said selected output terminal thereof, said method comprising providing the clock signal distributing circuit with delay adjustment means for varying said delay time between said input terminal and each said output terminal, short circuiting said input terminal and said selected output terminal of the distributing circuit by a line having a predetermined delay time to cause oscillation of said distributing circuit, and adjusting said delay adjustment means so that the frequency of said oscillation becomes a predetermined value corresponding to the desired delay time for said distributing circuit to transmit said pulse from said input terminal to said selected output terminal.

2. The method of claim 1, wherein the oscillation frequency is measured by a frequency counter connected to one of said output terminals of said clock signal distributing circuit other than said selected output terminal.

3. The method of claim 1, wherein the duty ratio of each said pulse transmitted by the distributing circuit is about 50%

4. A device for distributing clock signal pulses from a clock signal source to a plurality of load circuits and for adjusting the delay times for transmitting said pulses from the input terminal of the device to a plurality of output terminals of the device for selectively supplying said load circuits with said clock signals, the rise time for the transmission of each said clock pulse between said input and output terminals being known relatively to the fall time thereof, said device comprising adjustment means for varying the delay time for transmitting each said clock pulse from the input terminal to each said output terminal of said device, means for providing an output signal pulse at least one selected one of said output terminals that is opposite in polarity to the corresponding polarity of each said pulse applied at the input terminal, a short-circuiting line for shorting the input and said selected output terminal, to cause said device to oscillate, said short-circuit line having a predetermined delay time, and means for adjusting the oscillation frequency to a predetermined value corresponding to a desired value of the delay time for transmitting said clock pulse between said input terminal and each said output terminal.

5. The device of claim 4, said adjustment means comprising a discrete wire through which said clock signal pulses are propagated prior to being distributed within said device for output on said output terminals, and means for varying the length of said wire to provide said predetermined delay time for said transmission of each said clock pulse.

6. The device of claim 4, wherein the adjustment means comprises
   a plurality of series connected NOR gates of different stages provided in said device, and
   means for designating from the exterior of said device which of said NOR gates are to be connected for setting said desired delay time and for transmitting said clock signal pulses prior to distribution thereof within said device to said output terminals thereof.

7. The device of claim 4, said input terminal including a conductor portion within said device, wherein the adjustment means is provided in said conductor portion.

8. A device according to claim 4, wherein at least one of said load circuits comprises a chopper circuit for shaping said clock signal pulse to have a desired pulse width.

9. A device according to claim 4, wherein at least one of the load circuits includes a frequency mutiplier for frequency multiplying said clock signal pulse.

10. The method of claim 2 comprising setting said desired delay time with an uncertainty down to as little as approximately $10^{-2}$ picoseconds.

11. The device of claim 4, at least one of said load circuits comprising a circuit for doubling the frequency of said clock signal pulses, said doubling circuit comprising:
   an input terminal for receiving said clock signal pulses to be doubled and an input logic gate connected to said input terminal,
   an output terminal for outputting said frequency doubled pulses and an output logic gate connected to said output terminal,
   two parallel chopper circuits connected between said input and output logic gates, each said chopper circuit comprising means for providing an output pulse having width equal to a delay time that is characteristic of the chopper circuit, for input signals of length greater than said characteristic delay time, and for providing no output pulse for input signals less than said characteristic delay time, said said circuit comprising means for said frequency doubled output pulses to have pulse width equal to said characteristic delay time of said chopper circuits.

12. The device of claim 11, said input logic gate comprising an OR-NOR gate, said output logic gate comprising a NOR gate, and
   each said chopper circuit comprising a series connection of an odd number of inverter gates connected in parallel with a short circuit from a respective output of said OR-NOR gate to a respective NOR gate within each chopper circuit, the output of each said respective NOR gate being input to said output NOR gate of said circuit.

13. The method of claims 2 or 10, one of said load circuits comprising a frequency doubler, and said frequency counter being connected to the output of said frequency doubler load circuit.

14. The method of claim 1, 2 or 3, said clock signal distributing circuit comprising plural gates, said rise time being substantially equal to said fall time for each gate of said clock signal distributing circuit.

15. The device of claim 4, 5, 6, 7, 8, 9, 10, 11 or 12, said rise time being substantially equal to said fall time.

16. The method of claim 16, the rise time of each said gate of said clock pulse distributing circuit being substantially equal to its fall time.

17. The method of claim 1, 2 or 3, each said output terminal of said clock signal distributing circuit including a conducting line of a first length, except optionally said selected output terminal.

18. The device of claim 4, 5, 6, 7, 8, 9, 10, 11 or 12, each said output terminal of said clock signal distributing circuit including a conducting line of a first length, except optionally said selected output terminal.

* * * * *

UNITED STATES PATENT AND TRADEMARK OFFICE
CERTIFICATE OF CORRECTION

PATENT NO. : 4,337,433

DATED : 29 June 82

INVENTOR(S) : TATSURO YOSHIMURA

It is certified that error appears in the above-identified patent and that said Letters Patent is hereby corrected as shown below:

| | |
|---|---|
| Title page, | between "[22]" and "[51]" insert --[30] Foreign Application Priority Data Dec. 20, 1978 [JP] Japan.........158898--; |
| Title page, | [57] ABSTRACT, Line 10, "time" should be --times-- (both occurrences). |
| Col. 2, | line 8, after "invention" insert --,--. |
| Col. 3, | line 20, "in" should be --is--; line 60, "reverse" should be --reversed--. |
| Col. 4, | line 18, after "and" insert --25--; line 21, delete "the" (first occurrence). |
| Col. 8, | line 5, "said" (second occurrence) should be --and--; line 29, "16" should be --14--. |

Signed and Sealed this

Twenty-sixth Day of October 1982

[SEAL]

Attest:

GERALD J. MOSSINGHOFF

Attesting Officer

Commissioner of Patents and Trademarks